Aug. 6, 1957 D. M. CHAUVIN 2,802,064
MULTISTAGE AMPLIFIER SYSTEM
Filed June 14, 1954

WITNESSES
Edwin E. Bassler
T. H. Murray

INVENTOR
David M. Chauvin
BY F. E. Browder
ATTORNEY

United States Patent Office 2,802,064

Patented Aug. 6, 1957

2,802,064

MULTISTAGE AMPLIFIER SYSTEM

David M. Chauvin, Glen Burnie, Md., assignor to Westinghouse Electric Corporation, East Pittsburgh, Pa., a corporation of Pennsylvania Application June 14, 1954, Serial No. 436,333

4 Claims. (Cl. 179—171)

This invention relates to an amplifier circuit and, more particularly, to a method for stabilizing gain in an amplifier circuit.

In a multistage amplifier, the total gain (degree of amplification) is a product of the individual stage gains. In a tetrode or pentode multistage amplifier, the gain of each of the stages is, in turn, dependent upon the value of control grid-anode transconductance (henceforth called mutual conductance) of the tube contained therein. In designing a multistage amplifier using tetrodes or pentodes, the over-all gain is determined in reliance upon the tubes' rated mutual conductance values which are published by the manufacturer. Invariably, however, the actual mutual conductance values of tubes will vary from those published. Mutual conductance variation of plus or minus 20% from normal is common; and since tube characteristics have a tendency to run nearly alike for a given production "batch" or shipment, it is possible to have in an amplifier a group of tubes all having high or low mutual conductance values. This variation will obviously alter the expected over-all gain of the amplifier. For example, in a seven-stage amplifier having tubes whose greatest mutual conductance variation is plus 20%, it is possible to have a deviation from expected amplifier gain of slightly less than plus 12 decibels (or approximately four times greater than normal).

In order to compensate for the mutual conductance variation in tubes, I have provided a simple gain stabilizing circuit arrangement which provides excellent over-all gain uniformity in a multistage tetrode or pentode vacuum tube amplifier.

Another object of my invention lies in the provision of a method for achieving greatly improved gain stabilization over and above that obtained by devices normally used for gain stabilization (i. e., cathode dropping resistors).

A still further object of my invention is to provide a means for stabilizing the gain of an amplifier by minimum alteration of the normal amplifier circuit configuration.

In accordance with the invention hereinafter described, gain stabilization is achieved by the use of a common anode-screen grid compensating resistor for the complete amplifier. The direct-current supply points for the anode and screen grid of each tube in the amplifier are connected to a common junction and this junction is, in turn, connected through the compensating resistor to the positive terminal of a voltage supply. By selecting the correct value for the compensating resistor, the over-all gain of the amplifier is kept substantially constant for wide variations in mutual conductance and supply voltage. The stabilization derived is over and above that obtained by the common practice of using individual stage cathode bias resistors for compensation.

Figure 1:
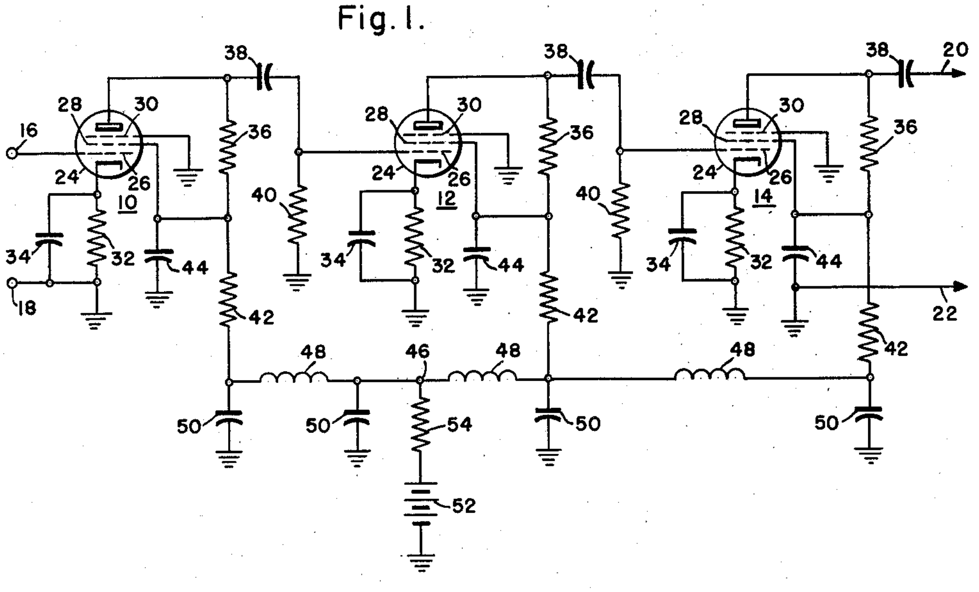
Figure 2:
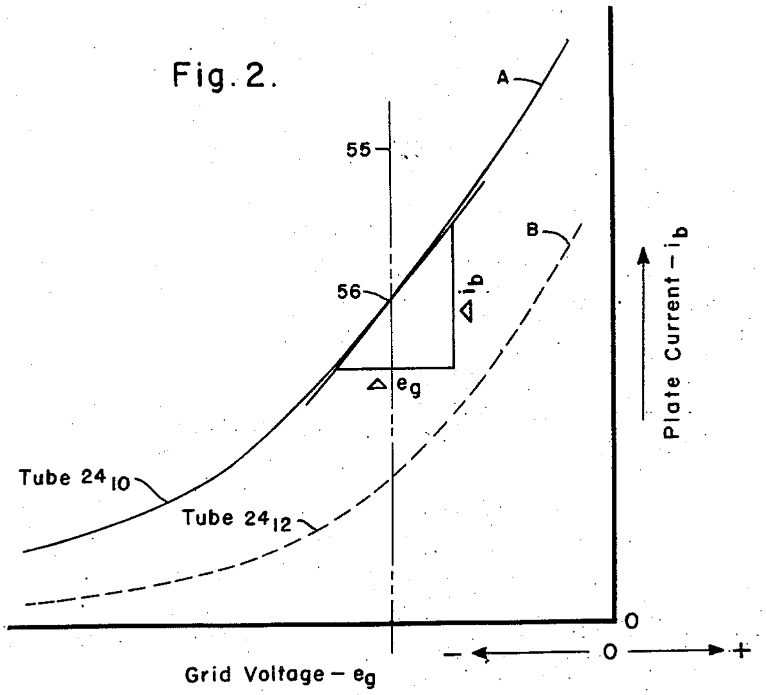

Other objects and features of my invention will become apparent from the following description taken in connection with the accompanying drawings which form a part of this specification and in which:

Figure 1 is a schematic illustration of a typical amplifier circuit with which my invention may be used; and Fig. 2 is a plot of grid voltage versus plate current for two different amplifier tubes using the screen grid voltage as a parameter.

In Fig. 1, a typical multistage amplifier is shown. It is to be understood that the present amplifier circuit is used for purposes of illustration only and that the invention can be used equally well with other and different types of amplifiers. The circuit of Fig. 1 illustrates a resistance-capacitance coupled amplifier having three stages 10, 12 and 14. A signal voltage applied to input terminals 16 and 18 will be successively amplified by the three stages and will appear at output terminals 20 and 22.

Each stage of the amplifier includes a pentode tube 24 having a control grid 26, screen grid 28 and suppressor grid 30 included therein. Connected to the cathode of each tube is a cathode biasing resistor 32 and bypass condenser 34. Input voltage signals applied to control grid 26 will appear across the anode load resistor 36 in the plate circuit of tube 24. In operation, the plate current of the tube flowing through resistor 36 has both direct and alternating components. Condenser 38 serves to block out the direct-current voltage component, leaving only the alternating component to be applied to resistor 40 in the grid circuit of the next succeeding stage. Connected to the negative potential side of resistor 36 is screen grid 28. Two paths are provided between the screen grid and ground. One path includes dropping resistor 42 and the other includes a condenser 44 which is required to prevent the direct-current screen grid potential from varying in response to input signal voltages. The plate circuits of the tubes for various stages are all connected to a common junction point 46 through interstage signal decoupling impedances 48 which reduce the signal frequency currents that enter the direct-current anode voltage source for the circuit. Bypass condensers 50 provide a low impedance path for any residual high-frequency current in the circuit and thus divert it to the cathodes of the respective tubes. All of the stages are supplied with voltage from a common direct-current voltage source 52. The positive terminal of source 52 is connected to junction 46 through resistor 54.

I have found that by making resistor 54 of a value such that the voltage drop thereacross is equal to approximately one-third or more of the total voltage available from source 52, the over-all gain deviation from that expected in view of published mutual conductance values is minimized for all tube variations. Although resistor 54 will cause gain stabilization if it effects a voltage drop which is greater than one-third of the total available anode voltage, anything over a one-third drop usually becomes impractical and inefficient since power from source 52 is merely dissipated in the resistor. Generally, the correct value of resistor 54, for good results, can be determined best by experiment. This novel method of gain stabilization is due to a correlation between mutual conductance and quiescent plate current which can best be understood by reference to the full-line curve A of Fig. 2, which illustrates the dynamic transfer characteristic of a typical amplifier tube. For a given constant value of screen grid voltage, the plate current will vary with respect to grid voltage, as shown. If a fixed grid bias of a value represented by line 55 is applied to the tube, a steady value of plate current is established which prevails for a zero-input signal voltage. This steady value is generally referred to as the quiescent value of plate current. The mutual conductance value of the tube under quiescent conditions is the slope of the transfer characteristic at point 56

$$\left(\text{i.e.,}\frac{\Delta ib}{\Delta eg}\right).$$

It can readily be seen that there is a close correlation between the mutual conductance and quiescent plate current of a tube. As the value of quiescent current decreases, the mutual conductance decreases also since the slope of the curve decreases at lower values. Therefore, for given values of screen-grid and plate voltage, low mutual conductance tubes exhibit low quiescent plate currents and high mutual conductance tubes exhibit high currents. This factor is illustrated in Fig. 2 by the second dotted-line transfer characteristic B. In this case, the value of screen grid voltage is the same as it was for curve A, but the mutual conductance value of the tube is lower than it was for the tube having characteristic A. Therefore, plate current has been diminished.

Assuming that curves A and B represent the characteristics of the tubes in the first two stages of Fig. 1, if the total current from tubes $\mathbf{24}_{10}$ and $\mathbf{24}_{12}$ is allowed to fall through resistor 54, the voltage at junction 46 adjusts itself to a value dictated by the quiescent plate currents of the two tubes. Tube $\mathbf{24}_{10}$ (high conductance) has a high plate current and, therefore, causes a large voltage drop across resistor 54. Since this resistor is also included in the screen grid circuit of tube $\mathbf{24}_{12}$ the increased voltage drop thereacross will cause the screen grid voltage of tube $\mathbf{24}_{12}$ to be lower (more negative with respect to the cathode) thereby causing its mutual conductance and plate current to be lower also. If tube $\mathbf{24}_{10}$ should have a lower mutual conductance value than tube $\mathbf{24}_{12}$, the effect will be reversed. The plate current from tube $\mathbf{24}_{10}$ will now be low, thereby causing a smaller voltage drop across resistor 54. This, in turn, will cause the screen grid voltage and mutual conductance of tube $\mathbf{24}_{10}$ to rise. Although only the two tubes have been used for purposes of this illustration, it is readily apparent that the effect will be the same for any number of cascade-connected tubes and as the number of tubes is increased from two, an improvement in compensation is experienced because of the magnified effects due to the larger variations in voltage drop across the compensating resistor as a result of the heavier currents of many stages.

It can, therefore, be seen that by using the compensating resistor 54, the variation in mutual conductance in one tube in the system will be adjusted for by an automatic variation in the effects of the mutual conduction values of the other tubes of the amplifier system. It should be noted that stabilization is not effected by merely averaging mutual conductance values of the tubes which exist for a given value of quiescent plate current. Rather, the stabilization is effected by an automatic adjustment in the mutual conductance of any one tube (by virtue of variable screen grid voltage) in response to the mutual conductance values of the other tubes in the system. Hence, all of the tubes in the amplifier can be of either high or low mutual conductance values. The gain stabilization effect will be the same in either case.

It should be noted that resistor 54 also compensates for variations in the supply voltage 52. For example, if the supply voltage should rise, the amplifier will tend to increase the voltage of the output signal appearing between terminals 20 and 22. However, at the same time, an increased voltage drop will be effected across resistor 54. This increased voltage drop will be reflected as a drop in the screen grid voltages of the tubes in the system (i. e., the screen grids become more negative). Hence, the plate current of the tubes will be reduced in proportion to the rise in voltage of source 52 to thereby stabilize the gain of the amplifier as voltage source 52 varies.

The amplifier configuration shown herein is, of course, more or less normal. However, by application of the principles disclosed, it is possible to get greatly improved gain stabilization for a wide variation in tube characteristics. Previous amplifier designs, of which I am aware, have approached the gain stabilization problem by entirely different methods which are much more complex. My experience has shown that by the means described herein, an amplifier of 100 decibels gain undergoes gain variations of less than two decibels between the case where all the tubes in the amplifier have high transconductance values and the case where all the tubes have low transconductance values. This in itself is exceptional since the allowed transconductance variation in each tube (specified by the manufacturer) is much greater than the total gain change observed in the stabilized amplifier.

I claim as my invention:

1. In a multistage amplifier having a plurality of amplification tubes therein, the combination of a common source of anode voltage for all of said tubes, an anode and a screen grid included in each of said tubes, a common junction to which said screen grids and said anodes are connected, and a common resistor connected between said anode voltage source and said common junction, said resistor being of a size such that the voltage drop thereacross constitutes at least one-third of the total voltage available from said voltage source whereby the gain of said amplifier will be substantially constant regardless of the mutual conductance values of said tubes.

2. In a multistage amplifier, the combination of a plurality of pentode amplification tubes, each of said tubes having an anode and a screen grid included therein, a common junction to which the anode and screen grid of each of said tubes are connected, a source of anode voltage for said tubes, and a resistance connecting said positive terminal and said junction, the size of said resistance being such that the voltage drop thereacross constitutes not less than one-third of the total voltage available from said voltage source whereby the gain of said amplifier will be substantially constant regardless of the mutual conductance values of said tubes.

3. In a multistage amplifier, the combination of a plurality of amplification tubes, each of said tubes having an anode and at least one grid included therein, a common junction to which the anode and said one grid of each of said tubes are connected, a source of anode voltage for said tubes, and an impedance connected between said junction and the positive terminal of said voltage source, the value of said impedance being such that the voltage drop thereacross constitutes at least one-third of the total voltage available from said source whereby the gain of said amplifier will remain substantially constant regardless of the mutual conductance values of said tubes.

4. A cascaded amplifier having a multi-grid amplifier tube included in each of its stages, a common junction to which the anode and one grid of each of the amplifier tubes is connected, a source of anode voltage for said tubes, and a common resistor connected between one side of said voltage source and said junction, said resistor being of a size such that the voltage drop thereacross constitutes at least one-third of the total voltage available from said source whereby the gain of the amplifier is maintained substantially constant for all variations in the voltage source and the mutual conductance values of said tubes.

References Cited in the file of this patent

UNITED STATES PATENTS

| | | |
|---|---|---|
| 2,354,514 | Gardiner | July 25, 1944 |
| 2,596,591 | Packard et al. | May 13, 1952 |
| 2,664,469 | Moehring et al. | Dec. 29, 1953 |